United States Patent [19]

Skotheim et al.

[11] 4,427,513

[45] Jan. 24, 1984

[54] METHOD FOR COATING A PLANAR SURFACE OF A SEMICONDUCTOR OR INSULATOR WITH A POLYMER FILM

[76] Inventors: Terje A. Skotheim, 41 Bay Rd., East Patchogue, N.Y.; Kurt I. Lundstrom, Fargaregatan 10, 582 52 Linkoping, Sweden

[21] Appl. No.: 336,448

[22] Filed: Dec. 31, 1981

[30] Foreign Application Priority Data

Jan. 21, 1981 [SE] Sweden ................................ 8100325

[51] Int. Cl.$^3$ ............................................ C25D 13/08
[52] U.S. Cl. ............................ 204/181 R; 204/181 E; 204/300 EC
[58] Field of Search ......... 204/181 R, 300 EC, 181 E

[56] References Cited

U.S. PATENT DOCUMENTS

| | | | |
|---|---|---|---|
| 3,501,390 | 3/1970 | Turner | 204/181 R |
| 3,679,572 | 7/1972 | Smith et al. | 204/300 EC |
| 3,738,835 | 6/1973 | Bakos | 704/181 E |
| 3,943,046 | 3/1976 | De Sorga et al. | 204/181 E |
| 4,104,064 | 8/1978 | Gruber | 204/181 E |

FOREIGN PATENT DOCUMENTS 2087928 6/1982 United Kingdom ............ 204/181 R

OTHER PUBLICATIONS

Nature, vol. 287, Oct. 16, 1980: A. E. Bell, "Optical Discs for Information Storage", pp. 583-585.
Journal of the Electrochemical Society, vol. 127, No. 10, Noufi, R. et al.: "Protection of n-GaAs Photoanodes with Photoelectrochemically Generated Polypyrrole Films", pp. 2310-2311.

*Primary Examiner*—R. L. Andrews
*Assistant Examiner*—Terryence Champan
*Attorney, Agent, or Firm*—Roland Plottel

[57] ABSTRACT

A method for coating a planar surface (5) of a semiconductor or insulator (3) with a polymer film according to a given pattern. The substrate to be coated constitutes one electrode (3) in an electrolytic cell whose electrolyte (2) contains monomers of said polymer. The substrate and the monomers are selected such that electrolytic oxidation or reduction occurs when a voltage is applied across the cell electrodes (3, 4) simultaneous with an area of the surface (5) to be coated being irradiated with radiation having energy larger than the energy gap between the valence band and conduction band of said substrate. The irradiation is performed with a sharply defined beam (10) simultaneous with a relative motion of said beam and the substrate surface (5) thereby making the polymer film of the desired pattern. The polymer, for example, is polypyrrole formed by electro-oxidation of a pyrrole monomer in an electrolytic solution containing pyrrole monomer and tetraethylammonium tetrafluoroborate in acetonitrile.

9 Claims, 1 Drawing Figure

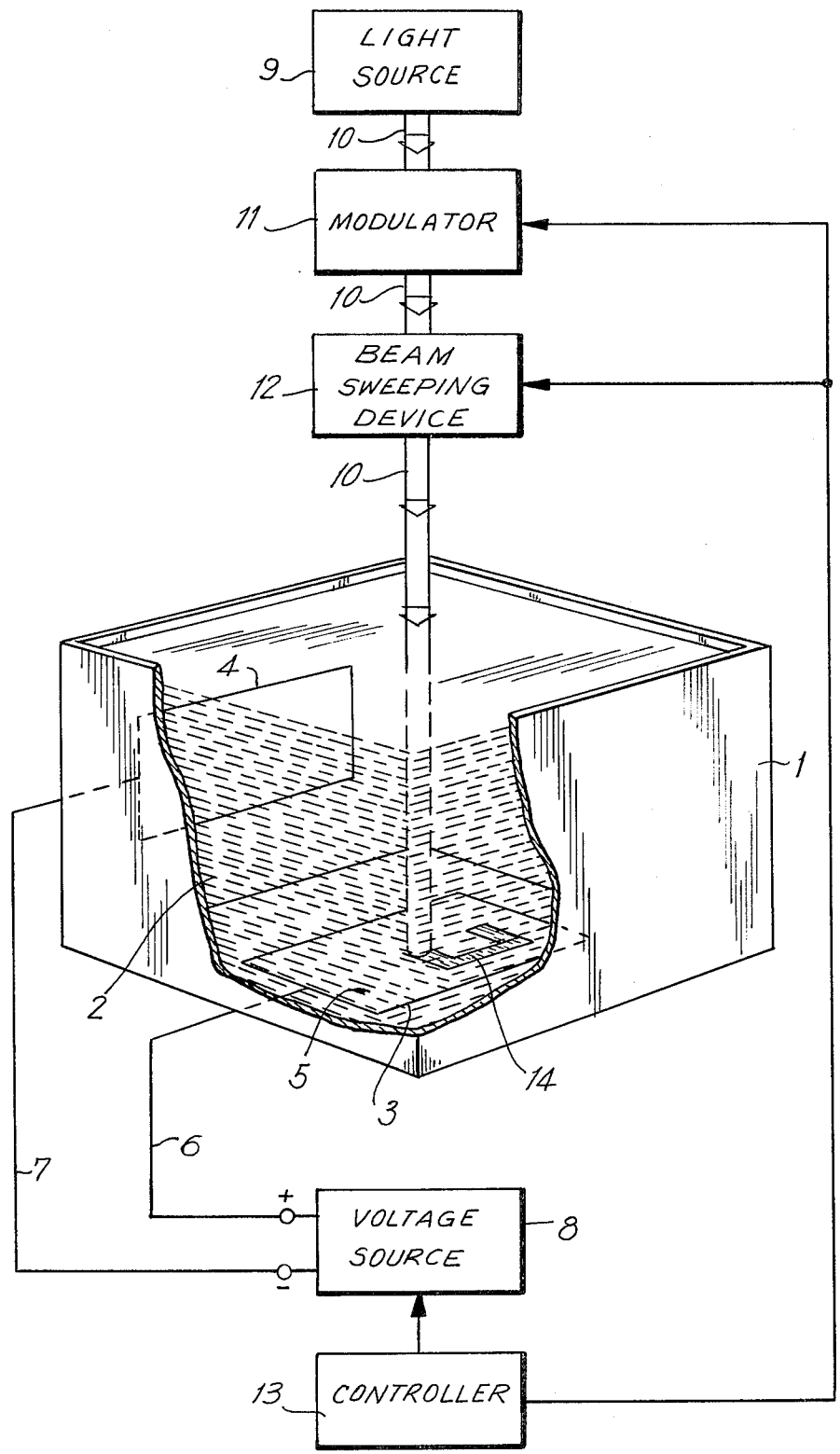

METHOD FOR COATING A PLANAR SURFACE OF A SEMICONDUCTOR OR INSULATOR WITH A POLYMER FILM

The present invention is a method for coating a planar surface of a semiconductor or insulator with a polymer film in a given pattern. The invention is also an apparatus for manufacturing said pattern on a planar surface of a semiconductor or insulator.

A pattern of this kind can be produced by well known methods using photolithographic techniques. They have the drawback of requiring specially constructed masks and transferring the pattern manually or automatically onto a precoated layer on the surface of the material in question. The desired pattern is then produced using processing steps which are well known to those who are skilled in the art.

One may consider the photolithographic methods as rather complicated for the production of patterns in small series, e.g. recording of information into an optical storage memory. The photolithographic techniques for generating patterns are therefore best suited for producing prerecorded pattern in large series.

According to a separate and independent prior method for generating a given pattern, a high intensity laser beam is used to burn the pattern into a metal layer. This method has been described in a paper by A. E. Bell, Nature 287, 583 (1980) and proposed as a method for generating optical information storage. Since this method consists of removing material, the laser beam has to be of very high intensity and a special light absorbing film is required, which makes the method not generally useable.

An object of the present invention is to provide a method for coating a semiconductor or insulator with a polymer film of a given pattern. The polymer can be conductive, semiconductive, or insulating. The film thickness can be controlled both by optical and electrical means.

Another object of the invention is to generate a conductive pattern on the surface of a semiconductor or insulator without using masks or precoated surfaces.

A further object of the invention is to generate very high density optical information storage.

These and other objects and features of the invention will be more fully understood from the following description. The present invention exploits a photoelectrochemical process, according to which the material to be coated is an electrode in an electrolytic cell whose electrolyte contains the monomer of a polymer. The substrate and the monomer are of such nature that electrolytic oxidation or reduction occurs when a voltage is applied across the cell electrodes simultaneous with the surface to be coated being illuminated with light of photon energy larger than the band gap of the substrate. The illumination being performed with a focused light beam in relative motion with the substrate in order that the polymer coating assumes the desired pattern.

An apparatus according to one aspect of the invention designed to be used in the coating of a planar surface of a semiconductor or insulator with a polymer film in a given pattern has a container with a light transmitting window, and with an electrolyte containing the monomers of the polymer to be deposited, and electrodes immersed in said electrolyte. One of the electrodes is the substrate to be coated, and is positioned such that its planar surface can be illuminated through said window. The other electrode is the counter electrode. A voltage source is connected to the electrodes for generating a voltage between them. A light source provides a focused beam directed at the substrate surface and has photon energy greater than the energy gap between the conduction and valence band of the substrate. A light modulator is positioned between the light source and the substrate for modulating the intensity of the light beam according to a programmed signal. A device sweeps the light beam over the substrate surface according to a programmed signal; said device is positioned in the light beam between the light source and the substrate; and a controller is coupled to the modulator and the sweeping device in order to control the light modulation and the sweep such that the desired pattern is generated.

The invention includes using electron beams as well as light beams to write the polymer pattern onto the semiconductor surface. By using electron beams instead of light beams, there can be obtained a pattern that is an order of magnitude finer. The electron beam has energy larger than the band gap of the substrate in order to generate electron-hole pairs. Electron beams can be focused to smaller spots than light beams which are limited by the wavelength of the light.

A photoelectrochemical method is described in a paper by R. Noufi, D. Tench, and L. F. Warren with the title "Protection of n-GaAs Photoanodes with Photoelectrochemically Generated Polypyrrole Films" published in the JOURNAL OF THE ELECTROCHEMICAL SOCIETY, Vol. 127, 2310 (1980).

One aspect of the invention is to provide a method for producing shades of gray in the pattern by modulating the intensity of the beam and/or modulating the amplitude of the voltage across the electrodes.

Another aspect of the invention is to produce a pattern with edge sharpness by using a substrate of polycrystalline or amorphous material. This makes possible the generation of optical information storage of very high packing density.

The invention will in the following be explained further by referring to the enclosed figure which schematically and in block diagram form shows an apparatus to be used in coating a planar surface of a semiconductor or insulator with a polymer film in a given pattern.

In the drawing is shown a container 1, having a solution 2 into which two electrodes 3, 4 are immersed. The electrode 3 has a planar surface 5 and is the substrate to be coated by the polymer film. The electrode 4 is a counter electrode. The solution 2 contains monomers of the polymer to be deposited onto the electrode 3. The electrodes are connected to a variable voltage source 8 with the wires 6, 7. The variable voltage source 8 can generate a varying voltage between the electrodes 3, 4. A light source 9 provides a focused beam 10 of photon energy greater than the band gap of the substrate 3. The light source is oriented such that the light beam 10 can illuminate a small area on the planar surface 5 of the electrode 3 onto which the light beam is focused. In the figure, the container 1 is open at the top and the electrode is placed near the bottom of said container with the planar surface 5 parallel to the surface of the solution 2. Alternatively, the container 1 can, of course, have a planar window or a planar transparent side wall and the light source 9 and the planar substrate 5 can be so arranged that the light beam 10 illuminates said surface 5 through said window or side wall.

A modulator 11 and a beam sweeping device 12 are placed in the light path between the light source 9 and the electrode 3. The modulator 11, which can be either mechanical or electro-optic, varies the light intensity of the light beam 10. The sweeping device 12 sweeps the light beam 10 over the surface 5. The modulator 11, the sweeping device 12, and the variable voltage source 8 are regulated by a controller 13, e.g. a computer.

The monomers in the solution 2 will polymerize on the spot which is illuminated by the light beam 10 when the potential difference between the electrodes 3, 4 has the right magnitude and polarity. By sweeping the light beam 10 with the sweeping device 12 according to a prescribed manner, the coated area 14 can assume a given pattern.

The method by which a polymer film is formed on the surface 5 is the following: The light beam 10 with which the surface 5 is illuminated consists of photons which when absorbed by the electrode 3 create electron-hole pairs. If the monomer in the solution 2 is of a kind that can be polymerized by electro-oxidation, the polymer will deposit on the surface 5 in the area which is illuminated. The electrode 3 is at a sufficiently positive potential relative to the counter electrode 4.

Doped semiconductors contain predominantly either electron (n-type) or hole (p-type) charge carriers. Electro-oxidation controlled by light can only take place with n-type semiconductor electrodes since in a p-type, there would already exist holes available to perform the electro-oxidation. The situation described in the figure therefore refers to the coating of an insulator or intrinsic or n-type semiconductor by an electro-oxidating polymer. This can for example be polypyrrole formed by electro-oxidation of pyrrole monomer in an electrolytic solution containing pyrrole monomer and tetraethylammonium tetrafluoroborate in acetonitrile.

It is obvious that with a sufficiently negative potential applied to the electrode 3, it can be coated in an analogous fashion by a polymer formed by electro-reduction. In this case, only the coating of p-type semi-conductors can be controlled by illumination.

When the invention is used to generate an optical memory, advantage can be taken of the fact that many substrates can have a naturally reflecting surface (e.g. amorphous silicon) or can be polished to a highly reflecting surface (e.g. single crystal silicon) whereas the deposited polymer (e.g. $BF_4^-$ doped polypyrrole) is strongly light absorbing if of a sufficient thickness.

The pattern 13 is formed by sweeping the light beam 10 over the surface 5, simultaneously keeping the voltage between the electrodes 3, 4 constant, and modulating the light intensity such as to write a "1" (e.g. full intensity) or a "0" (e.g. no light); or by applying a sufficient potential for polymerization between the electrodes 3, 4 only where a polymer film is desired. The writing of information becomes particularly simple by employing a light beam of constant light intensity and modulating the voltage with the controller 13 which is coded with the information to be written in the optical memory.

When the substrate 3 is polycrystalline or amorphous, the charge carriers generated by the light beam 10 will not diffuse very far from the illuminated spot. A polymer film pattern with a well defined edge can therefore be generated and the size of the area which will be coated by a polymer film is determined by the diameter of the light beam 10.

A pattern with shades of gray can be generated by modulating the voltage or light intensity or both. With the proposed method, one can therefore generate pictures.

By adding to solution 2 a substance which can dope the polymer (e.g. $BF_4^-$ in a solution of pyrrole in acetonitrile) to be deposited on the surface 5, a film of a highly conductive polymer can be generated. This method can therefore generate a well defined conductive pattern on the surface of a semiconductor or insulator. This can be produced by modulating the light intensity of the beam 10, the voltage between the electrodes 3,4 and/or by moving the light beam 10 over the surface 5 in the desired pattern.

Electron beams instead of light beams can be used to generate a pattern. This is still an order of magnitude finer. The electron beam has energy larger than the band gap of the substrate in order to generate electron-hole pairs. Electron beams can be focused to smaller spots than light beams which are limited by the wavelength of the light.

We claim:

1. A method of selectively coating a surface of a semiconductor or insulator substrate with a polymer film of a given pattern comprising the steps of
   (a) placing a substrate to be coated in an electrolytic cell with said substrate as one electrode
   (b) providing a counter electrode in said cell
   (c) said cell containing an electrolyte comprising monomers of a polymer forming said film
   (d) applying a voltage to the electrodes of said cell
   (e) simultaneous with the application of said voltage irradiating a selected portion of said surface, the energy of said irradiation being larger than the band gap between the valance band and the conduction band of said substrate,
   whereby said monomer forms a polymer on said surface in said irradiated region.

2. A method according to claim 1 wherein said radiation is in a sharply focused beam, and the further step of relatively moving the substrate and said beam such that said polymer coating assumes said pattern, in accordance the landing of the beam on said substrate.

3. A method according to claim 2, wherein said beam is a focused light beam.

4. A method according to claim 2, wherein said focused beam is an electron beam.

5. A method according to claim 2, wherein the intensity of the beam is modulated in order to generate the desired pattern.

6. A method according to claim 2, wherein the amplitude of the voltage across the cell electrodes is modulated in order to generate the desired pattern.

7. A method according to claim 2, wherein the substrate is polycrystalline or amorphous whereby the polymer pattern assumes a high edge sharpness.

8. A method according to claim 2, wherein said electrolyte solution contains pyrrole monomer and tetraethylammonium tetrafluoroborate in acetonitrile.

9. A method according to claim 2, wherein said irradiation is polarized light.

* * * * *